(12) United States Patent
Ishida (10) Patent No.: US 7,566,152 B2
(45) Date of Patent: Jul. 28, 2009

(54) VEHICULAR LAMP UNIT

(75) Inventor: Hiroyuki Ishida, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 76 days.

(21) Appl. No.: 11/789,363

(22) Filed: Apr. 24, 2007

(65) Prior Publication Data

US 2007/0253212 A1 Nov. 1, 2007

(30) Foreign Application Priority Data

Apr. 26, 2006 (JP) ............................... 2006-122726

(51) Int. Cl.
*F21V 1/00* (2006.01)
(52) U.S. Cl. ........................ 362/509; 362/244; 362/309; 362/545
(58) Field of Classification Search ................. 362/244, 362/209, 521, 545, 309
See application file for complete search history.

(56) References Cited

U.S. PATENT DOCUMENTS

| 7,131,758 B2 | 11/2006 | Ishida | |
|---|---|---|---|
| 2006/0067651 A1* | 3/2006 | Chui | ........................... 385/147 |

* cited by examiner

*Primary Examiner*—Sandra L O'Shea
*Assistant Examiner*—Meghan K Dunwiddie
(74) *Attorney, Agent, or Firm*—William L. Androlia; H. Henry Koda (57) ABSTRACT

A vehicular lamp unit including a flat-surfaced light source module and a projection lens that projects the image of light emitted from the light source module to the front as an inverted image. The light source module is comprised of a substrate and a light-emitting diode element disposed on the substrate and is formed therein with a subwavelength grating that reduces the reflection of light; and the formation density of the subwavelength grating is varied from position to position so as to vary the distribution of light emission intensity in the inverted image projected to the front.

4 Claims, 9 Drawing Sheets

FIG. 9B

VEHICULAR LAMP UNIT

BACKGROUND OF THE INVENTION

1. Field of the Invention

The present invention relates to a vehicular lamp unit that creates a predetermined light distribution pattern with a light radiated from its semiconductor light-emitting element.

2. Description of the Related Art

Predetermined configuration and illuminance distribution are required for a light distribution pattern of a vehicular headlamp. In other words, vehicular headlamps need to create a low-beam distribution pattern that has high forward visibility and in which a contrast boundary (horizontal cut-off line) is created by removing a part of the radiated light.

In recent years, semiconductor light-emitting elements, such as light-emitting diodes (LED), have technically improved remarkably so that they have an enhanced luminance and low power consumption. As a result, they are expected to be used as a vehicular light source of next-generation.

Conventionally, a vehicular lamp unit that employs this type of LED includes a plurality of optical units that project the shape of an LED chip so as to create a predetermined configuration and illuminance distribution by way of overlapping the distributed lights.

U.S. Pat. No. 7,131,758 for example, discloses a vehicular lamp unit that contains a plurality of lamp units which radiate light to create a horizontal cut-off line. In this vehicular lamp, each of the lamp units is comprised of a light source and a projection lens. The light source includes a light-emitting diode in which a light-emitting chip configured in a rectangular shape is provided to face the front with one side of the rectangular chip horizontally extending, and the projection lens is provided in front of the light source to project the light source image to the front of the lamp as an inverted image. With this structure, the inverted image of the light source projected to the front of the lamp is an image that has a substantially rectangular shape with an upper edge thereof extending substantially horizontally. In this construction, the vehicular lamp unit employing LEDs controls the predetermined light distribution pattern and illuminance distribution.

In the above-described vehicular lamp unit that employs conventional LEDs, a plurality of optical units that project the shape of the LED chip are provided, and by way of allowing the light distributed to overlap each other, a predetermined shape and illuminance distribution is obtained. However, this results in an enlargement of lamp unit in size, causing high production cost.

Accordingly, what has been long awaited so as to be used practically is a vehicular lamp unit in which a single unit that directly projects an image of LED chip creates a predetermined shape and illuminance distribution.

Figure 9A:
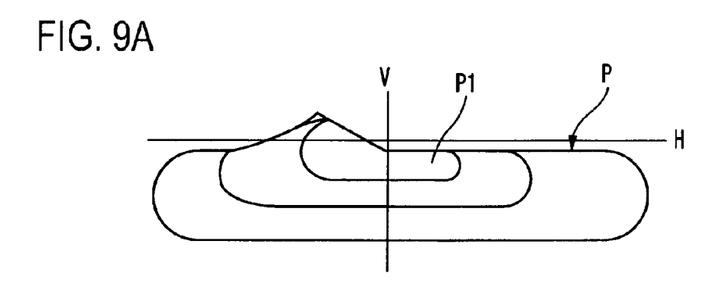
FIGS. 9A and 9B are explanatory diagrams showing the light distribution pattern and illuminance gradient created by a conventional vehicular lamp unit.
Figure 9B:
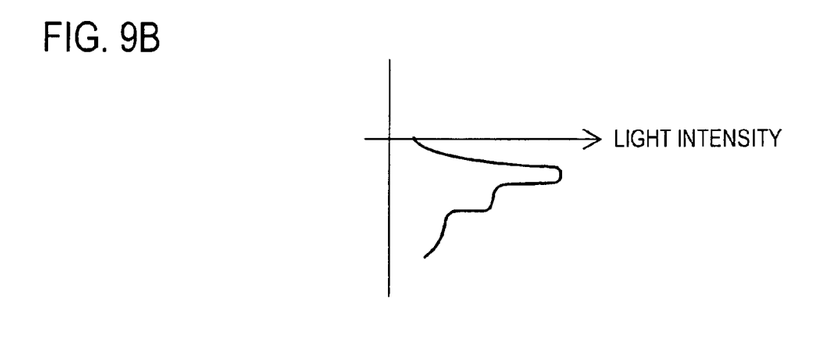

However, LED chips emit light at a substantially constant luminance across the entire light-emitting region. In a direct optical system that directly projects the image of LED chip, a low-beam distribution pattern P as shown in FIG. 9A is created by controlling the image by a projection lens to horizontally and vertically enlarge the image of the LED chip. However, since the image of the LED chip at uniform luminance per unit area is projected, luminance in a part of the pattern center portion P1 which is required to obtain particularly high forward visibility declines. Accordingly, the problem is that uneven illuminance gradient in the light distribution pattern occurs as illustrated in FIG. 9B.

In addition to high luminance, recent semiconductor light-emitting elements emit white light, and such semiconductor light-emitting elements are ready for practical use, and it is more and more expected that semiconductor light-emitting elements be used as a vehicular light source in place of conventional halogen lamps. However, when light distribution and illuminance are considered, semiconductor light-emitting elements have disadvantages that there is a variation in the color of emitted light and they tend to emit bluish white or yellowish light.

BRIEF SUMMARY OF THE INVENTION

The present invention is to overcome the foregoing problems, and it is an object of the present invention to provide a vehicular lamp unit that is able to create a light distribution pattern of smooth illuminance gradient even when the lamp is formed with a single unit including a semiconductor light-emitting element.

The above-described object is accomplished by a unique structure of the present invention for a vehicular lamp unit that includes a light source module that is comprised of a substrate and a plurality of layers which are disposed on the substrate and include at least one light-emitting layer, and an optical element for projecting an image of light emitted from the light source module to the front of the vehicular lamp unit as an inverted image; and in this structure,

- a subwavelength grating that reduces reflection of light is formed on the surface of one of the plurality of layers of said light source module, and
- a formation density of the subwavelength grating is varied from position to position so as to vary a distribution of light emission intensity in the inverted image projected to the front.

In this vehicular lamp unit of the present invention, total reflection of light is prevented from occurring inside the chip (light-emitting module) in the area of the subwavelength grating that has a high asperity density, and a large amount of light is emitted to the surface of the chip. On the other hand, total reflection occurs inside the chip in the area of the subwavelength grating that has a low asperity density, and a small amount of light is emitted to the surface of the chip. Accordingly, by gradually varying the asperity density, the light emission luminance on the surface of the chip varies from bright to dark in a manner that the luminance gradually changes.

In the vehicular lamp unit of the present invention as described above, it is preferable that the plurality of layers comprises:

- a semiconductor light-emitting element disposed on the substrate;
- a phosphor layer disposed so as to cover the semiconductor light-emitting element; and
- an encapsulation member having a flat surface and formed on the phosphor layer.

According to the vehicular lamp unit thus constructed, at least one layer disposed on the substrate is a semiconductor light-emitting element that functions as a light-emitting layer; and when the light emitted from this light-emitting layer travels through the phosphor layer disposed to cover the light-emitting layer, a part of the light turns into colored light, in which the phosphor is excited, and is emitted from the surface of the flat encapsulation member.

As a result, it is possible to uniformly emit, for example, white light that is obtained by mixing blue light from the light-emitting layer and the excitation-emitted light from the phosphor layer.

In the vehicular lamp unit of the present invention, it is preferable that the surface of the top layer provided in the light source module have a substantially rectangular shape, and the density of the subwavelength grating be set to gradually vary from one side to the other of two sides, which are opposing to each other, of the substantially rectangular top layer.

In this vehicular lamp unit, the subwavelength grating provided on the top layer of the light source module is substantially rectangular in shape, and the density of the subwavelength grating gradually varies from one side to the other.

Accordingly, it is possible to gradually vary the light extraction efficiency from the light-emitting layer, so that a desired light distribution pattern is formed with a uniform illuminance distribution.

In addition, in the vehicular lamp unit of the present invention, it is preferable that the vehicular lamp unit be a direct projection lamp unit, wherein the optical element is a projection lens, and the light source module is disposed in the proximity of the focal point of the projection lens.

In this structure, the projection lens forms an enlarged image of the top layer of the light source module, and the radiation pattern configuration, which is similar to the outline of the light-emitting region of the top layer of the light source module, is created. In addition, since the subwavelength grating in which the density gradually varies is provided on the top layer, the light distribution pattern in a predetermined configuration with a uniform illuminance distribution is created.

As seen from the above, according to the vehicular lamp unit of the present invention, the subwavelength grating that reduces the reflection of light is provided on the surface of one of the layers of a light source module, and the formation density of the subwavelength grating is varied from position to position so as to vary the distribution of light emission intensity in an inverted image projected to the front. Accordingly, total reflection is prevented inside the chip (light-emitting module) in the area that has a high asperity density in the subwavelength grating, so that a large amount of light is emitted to the surface of the chip. On the other hand, total reflection occurs inside the chip (light-emitting module) in the area that has a low asperity density in the subwavelength grating, so that a small amount of light is emitted to the surface of the chip.

Accordingly, by way of gradually changing the density of asperity in the subwavelength grating, the light emission luminance on the surface of the chip (light-emitting module) varies from bright to dark in such a manner that the luminance gradually varies; and by projecting the image of the chip using the direct-projection optical system, the light distribution pattern having smooth illuminance gradient can be created even by a lamp formed of a single lamp unit.

DETAILED DESCRIPTION OF THE INVENTION

Hereinafter, preferred embodiments of a vehicular lamp unit according to the present invention will be described with reference to the accompanying drawings.

Figure 1:
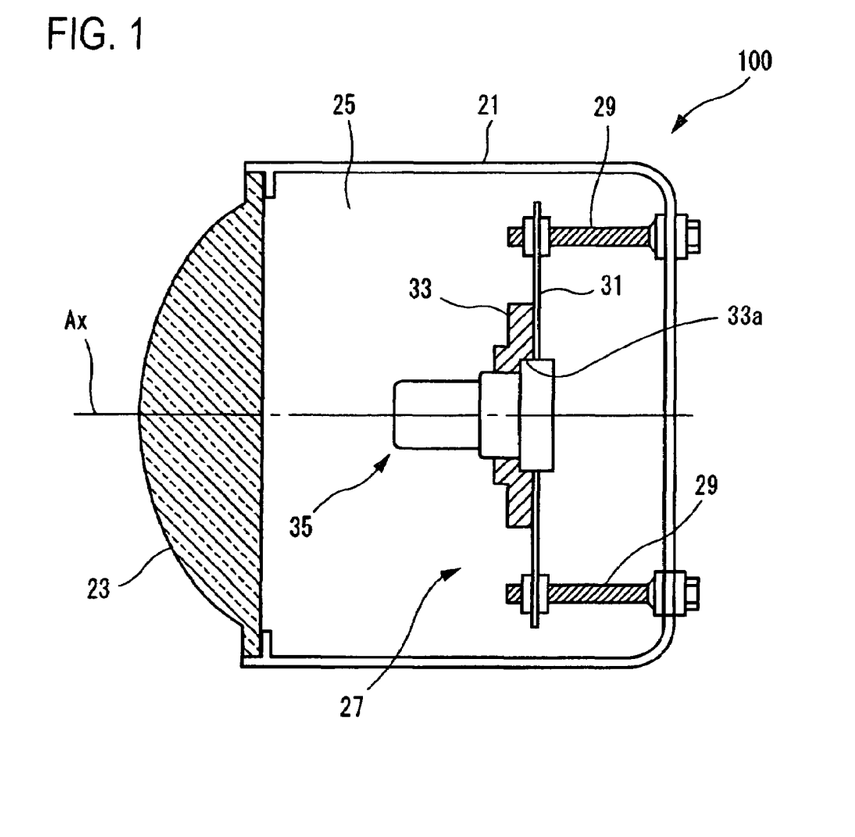
FIG. 1 is a cross-section of a vehicular lamp unit according to the present invention.

FIG. 1 shows the cross-section of a vehicular lamp unit according to one embodiment of the present invention.

The vehicular lamp unit 100 of this embodiment is an LED-type lamp unit, and it is preferably used as a low-beam headlamp for automobiles. As seen from FIG. 1, the vehicular lamp unit 100 includes a lamp unit 27 which is disposed in a lamp chamber 25 and emits light. The lamp chamber 25 is defined by a lamp body 21 and a projection lens 23. The projection lens 23 is the optical element of the vehicular lamp unit 100.

The lamp unit 27 is attached to the lamp body 21 through aiming mechanisms 29 that adjust the optical axis Ax of the lamp unit 27. The aiming mechanisms 29 are provided with a movable plate 31 that has there on a light source support 33. The lamp unit 27 includes an LED module (light source module) 35 that emits light. An attachment opening 33a is formed in the light source support 33, and the LED module 35 is fixedly inserted into the attachment opening 33a.

The LED module 35 of the shown embodiment radiates light in a predetermined light distribution pattern to the front of the vehicle using the light emitted. The lamp unit 27 is supported on the lamp body 21 so that the optical axis Ax extends to have a downward angle of approximately 0.3° to 0.6°, for example, when the vehicular lamp unit 100 is mounted on a vehicle body. For the lamp unit 27, a semiconductor laser, for instance, can be used in place of the LED module 35.

A circuit unit (not shown) is provided inside the lamp body 21. The circuit unit includes, for example, a lighting circuit that lights the LED module 35. The circuit unit is electrically connected to the LED module 35 via cables and is also electrically connected to the outside of (or to an electrical power source for) the vehicular lamp unit 100.

In the lamp body 21, a heat-radiation member (not shown) that functions as a heat sink is provided. The heat-radiation member is in contact with at least a part of the lamp unit 27, and it is formed of a material having higher thermal conductivity than that of the air, such as metal. Further, the heat-radiation member is provided so as to be movable with the LED module 35 within a range, for example, in which the lamp unit 27 is moved with respect to the fulcrum points of the aiming mechanisms. The heat-radiation member is disposed apart from the lamp body 21 by a distance sufficient to adjust the optical axis of the lamp unit 27.

Figure 2:
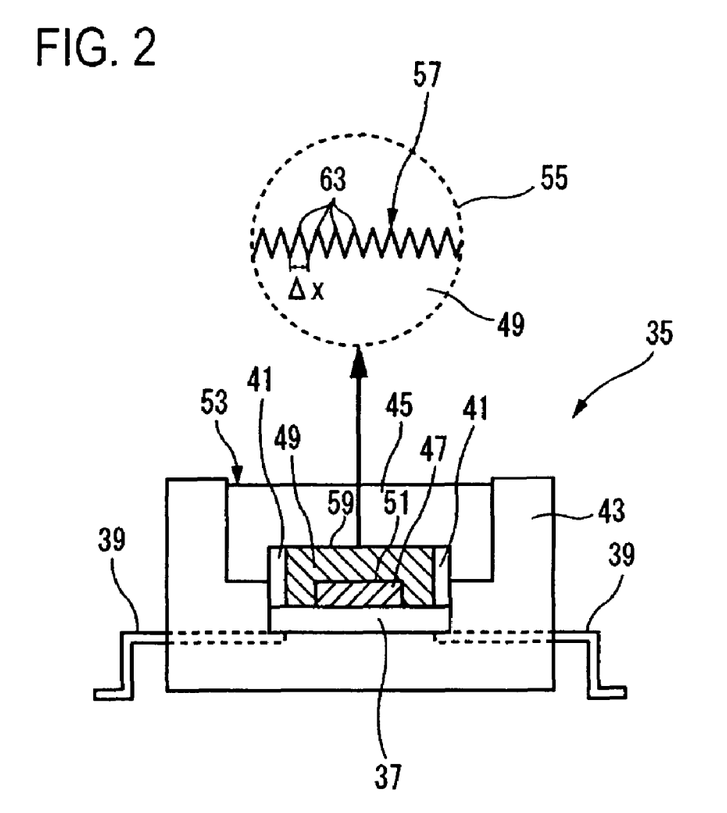
FIG. 2 is a cross-sectional view of one construction of an LED module (light-emitting module) used in the present invention.
Figure 3:
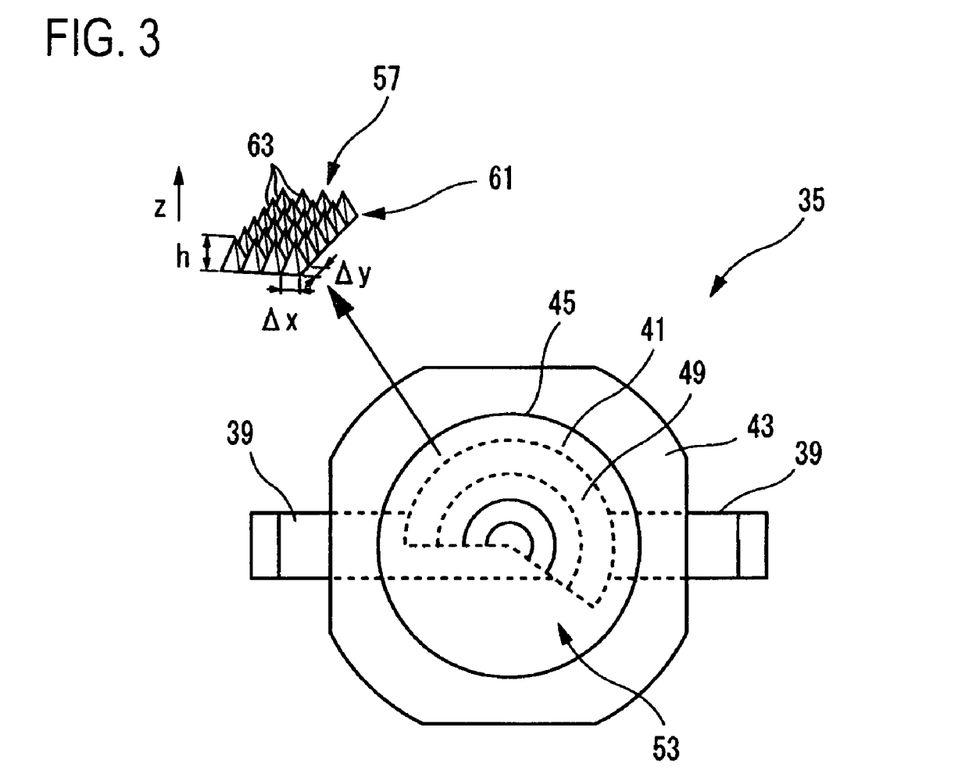
FIG. 3 is a top view of the LED module of FIG. 2.

FIG. 2 shows, in cross-section, the construction of the LED module 35. FIG. 3 is a top view of the LED module of FIG. 2.

The LED module 35 is an example of a light-emitting module that emits light, and it includes a substrate 37, a plurality of electrodes 39, a cavity 41, a supporting portion 43, an encapsulation member 45, a light-emitting diode element 47 serving as a light-emitting layer, and a phosphor layer 49.

The substrate 37 is a flat plate, and on its upper surface the light-emitting diode element 47 is disposed and fixed. The substrate 37 includes interconnections that electrically connect the electrodes 39 and the light-emitting diode element 47, and it supplies electric power received from the plurality of electrodes 39 to the light-emitting diode element 47. The plurality of electrodes 39 supply electric power received from the outside of the LED module 35 to the light-emitting diode element 47 through the substrate 37. The cavity 41 is a hollow space created above the substrate 37 so as to surround the light-emitting diode element 47, and the phosphor layer 49 is held in the cavity 41.

The supporting portion 43 has the plurality of electrodes 39, the substrate 37, the cavity 41, and the encapsulation member 45. Further, at least a part of the supporting portion 43 is formed of a material having higher thermal conductivity than that of the air, such as metal, so that the supporting portion 43 transmits the heat generated by the light-emitting diode element 47 to the outside of the LED module 35 through, for example, the substrate 37.

The light-emitting diode element 47 is an example of a semiconductor light-emitting element that emits light. The light-emitting diode element 47 emits blue light, for example, in accordance with the electric power received from the outside of the LED module 35 through the electrodes 39 and substrate 37. In this embodiment, the light-emitting diode element 47 uses substantially the entire area of its light-emitting surface 51, which is the surface opposing to the encapsulation member 45, as a light-emitting region to emit light. The outline of the light-emitting surface 51 is a substantially sector shape. In addition, as another example, the light-emitting diode element 47 emits, for example, ultraviolet light in place of blue light. The LED module 35 can employ, for example, a laser diode element, instead of the light-emitting diode element 47, as the semiconductor light-emitting element.

The phosphor layer 49 is provided by filling a phosphor material in the cavity 41 so that it covers the light-emitting diode element 47. The outline of the phosphor layer 49 is also a substantially sector shape. The phosphor layer 49 emits light of yellow, which is a complementary color of blue, in response to the blue light emitted from the light-emitting diode element 47.

With the structure described above, the LED module 35 generates white light using the blue light and the yellow light emitted from the light-emitting diode element 47 and the phosphor layer 49, respectively.

The phosphor layer 49 can be the one that emits red light, green light, and blue light in response to the ultraviolet light emitted from the light-emitting diode element 47. In this case, the LED module 35 generates white light using the red light, green light, and blue light from the phosphor layer 49.

The encapsulation member 45 is a mold that encapsulates the light-emitting diode element 47. In the shown embodiment, the encapsulation member 45 encapsulates the light-emitting diode element 47 and phosphor layer 49 with a material transmissive of white light. The encapsulation member 45 is opposed to the light-emitting diode element 47 with the phosphor layer 49 in between. "White light" herein is one example of the light emitted from the LED module 35.

The encapsulation member 45 has a light emitting surface 53 and is in contact with the air at this light emitting surface 53. The light emitting surface 53 is plane and parallel to the light-emitting surface 51 of the light-emitting diode element 47, thus being flat. The encapsulation member 45 emits light, which is incident from the interface opposing to the light-emitting diode element 47, toward the outside from the light emitting surface 53. In this way, the encapsulation member 45 allows blue light emitted from the light-emitting diode element 47 and yellow light emitted from the phosphor layer 49 to travel therethrough, so that such lights are emitted from the light emitting surface 53 into the air.

The light-emitting diode element 47 includes, for example, a sapphire substrate (not shown) and a semiconductor layer (not shown) formed on the sapphire substrate. Such a sapphire substrate has a refractive index of about 1.8 (ranging from, for example, 1.75 to 1.85). Furthermore, the semiconductor layer is formed of, for example, InGaN and has a refractive index of about 2.2 to 2.5, for example. The semiconductor layer may have a refractive index of about 2 to 4, for example. In the shown embodiment, the light-emitting diode element 47 is flip-chip mounted on the substrate 37 so that the sapphire substrate is opposed to the encapsulation member 45, and the light-emitting diode element 47, using the surface of the sapphire substrate as the light-emitting surface 51, emits light.

The surface of the sapphire substrate, such surface being opposed to the encapsulation member 45, is formed with a subwavelength grating (SWG) 57 as shown in circle 55 in FIG. 2. The subwavelength grating 57 is formed in smaller grating intervals than the wavelength of the light that travels through the sapphire substrate, thus reducing the reflection of light on the surface of the phosphor layer 49 (an opposing surface 59). The enlarged view 61 in FIG. 3 shows the subwavelength grating 57 when viewed from diagonally above.

In the present invention, the layer on which the subwavelength grating is provided includes the sapphire substrate, the semiconductor layer, the phosphor layer and the encapsulation member.

Figure 4:
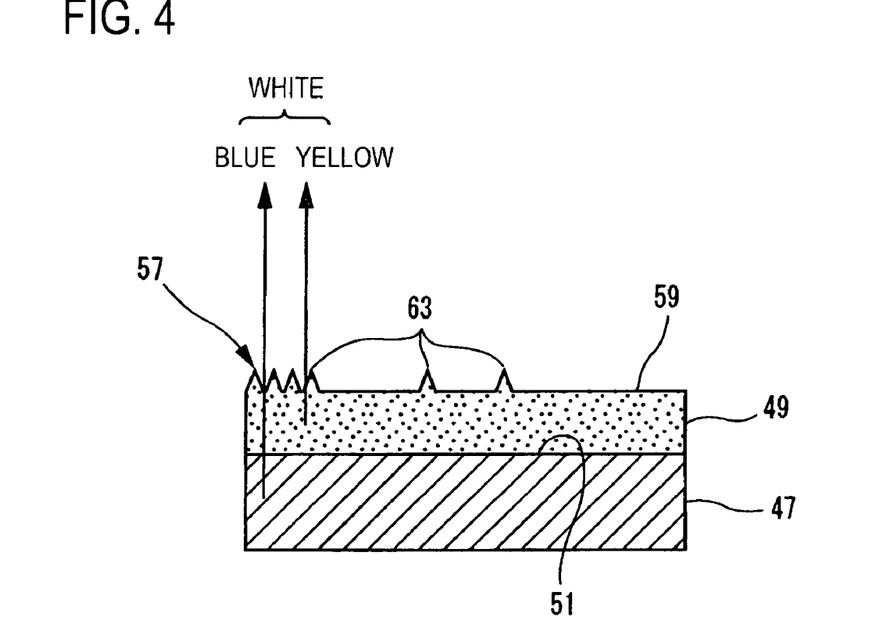
FIG. 4 is an enlarged cross-sectional view of the main portion of an LED module in which a subwavelength grating is provided on the surface of a phosphor layer.
Figure 5:
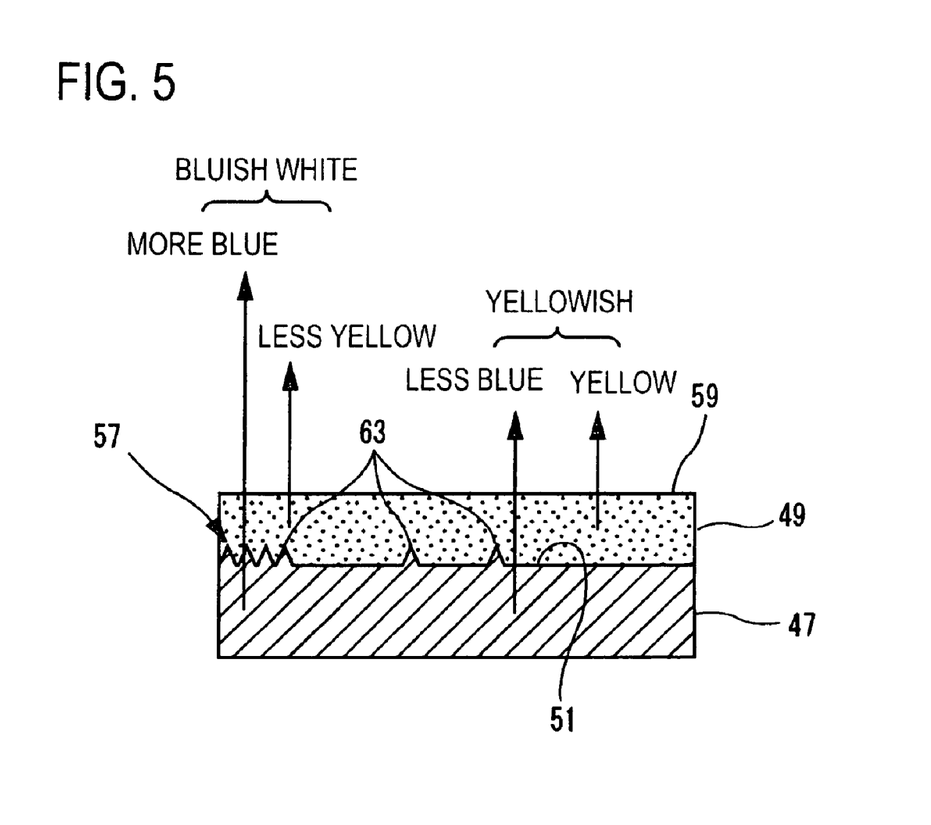
FIG. 5 is an enlarged cross-sectional view of the main portion of an LED module in which a subwavelength grating is provided on the surface of a light-emitting diode element.
Figure 6:
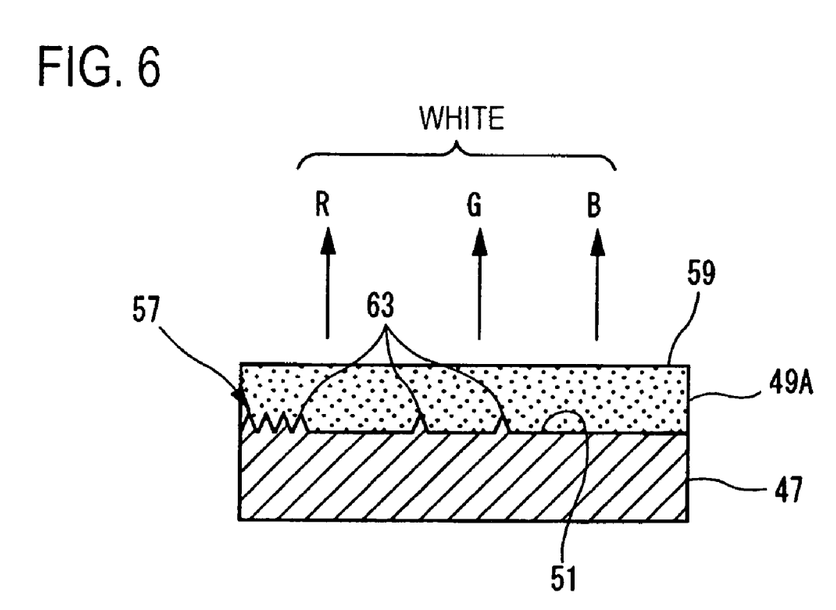
FIG. 6 is an enlarged cross-sectional view of the main portion of an LED module in which a phosphor layer including RGB phosphors is formed on the light-emitting diode element.

FIG. 4 is a cross-sectional view of the main portion of an LED module in which a subwavelength grating is provided on the upper surface of the phosphor layer 49. FIG. 5 is a cross-sectional view of the main portion of an LED module in which the subwavelength grating is provided on the surface of the light-emitting diode element 47. FIG. 6 is a cross-sectional view of the main portion of an LED module in which a phosphor layer having RGB phosphors is formed.

When the light-emitting diode 47 emits colored light, a phosphor layer (yellow phosphor layer) 49 is, as shown in FIG. 4, formed on the light-emitting diode element (blue light-emitting chip) 47, and the subwavelength grating 57 is provided on the opposing surface 59, which is opposed to the encapsulation member 45 and is one surface in the LED module 35.

The phosphor layer 49 generates fluorescence in response to the blue light emitted by the light-emitting diode element 47, thus emitting yellow light. The light-emitting diode element 47 and the phosphor layer 49 emit blue light and yellow light, respectively, which have colors in a complementary relationship, so that white light is generated from LED module 35. Further, in this case, the sapphire substrate (not shown) allows the blue light emitted from the light-emitting diode element 47 to travel therethrough and to be emitted through the opposing surface 59 into the encapsulation member 45.

In the shown embodiment, the blue light and the yellow light are mixed so as to exhibit white light, and therefore, as shown in FIG. 5, when the subwavelength grading 57 is provided on the surface (light-emitting surface 51) of the light-emitting diode element 47, it becomes difficult to adjust the color balance between blue and yellow, and the light emitted tends to be bluish white light or yellowish light.

As shown in FIG. 6, a phosphor layer 49A can emit red light, green light, and blue light in response to the ultraviolet light emitted by the light-emitting diode element 47. In other words, the phosphor layer 49A includes a plurality of types of phosphor particles that emit light of different colors, respectively. Each type of the phosphor particles emits the red light, green light, or blue light in response to the ultraviolet light.

With this arrangement, the phosphor layer 49A generates white light in response to the ultraviolet light. Further, when the RGB phosphor layer (trimixture phosphor layer) 49A is formed (on any of the subwavelength grating 57, the light-emitting surface 51, and the phosphor layer), it is made easy to obtain the white light in which red (R), green (G), and blue (B) are well balanced. In addition, since the phosphor layer 49A emits the light of three primary colors, white light with good color rendering properties is generated.

In the above-described embodiment, the subwavelength grating 57 is comprised of a plurality of protrusions 63 that protrude in a direction perpendicular to the opposing surface 59 (Z direction) in the structure of FIG. 4. In the structures of FIGS. 5 and 6, the protrusions 63 protrude in the direction perpendicular to the light-emitting surface 51 (Z direction). In the structure of FIG. 4, if no diffracted wave occurs, the subwavelength grating 57 is equivalent to a medium that has an intermediate effective refractive index between the effective refractive indices of the inside and the outside of the sapphire substrate with respect to the light incident from the inside of the sapphire substrate onto the opposing surface 59.

It is preferable that the plurality of protrusions 63 be disposed, as shown in FIG. 3, at grading intervals Δx and Δy, which are smaller than a half wavelength of the light that travels through the sapphire substrate. For example, the grating intervals of the plurality of protrusions 63 can be smaller than the half wavelength of the ultraviolet light inside the sapphire substrate. It is also preferable that the height h of the protrusions 63 be greater than the half wavelength of the ultraviolet light that travels through the sapphire substrate. In this case, the height h of the protrusions 63 can be greater than the half wavelength of the ultraviolet light inside the phosphor layer 49. With this arrangement, it is possible to further appropriately reduce the reflection on the opposing surface 59.

When the light-emitting diode 47 emits blue light, the grating intervals Δx and Δy at which the plurality of protrusions 63 are disposed can be smaller than the half wavelength of the blue light inside the sapphire substrate. Further, the height h of the protrusions 63 can be greater than the half wavelength of the blue light inside the phosphor layer 49.

The protrusions 63 may have, for example, a cone shape, or a pyramid shape. It is preferable that the protrusions 63 be formed in a tapered shape in which the cross-sectional area gradually decreases heightwise (or toward the tip end). Further, it is also preferable that the aspect ratio of the protrusions 63 be one or greater.

Figure 7A:
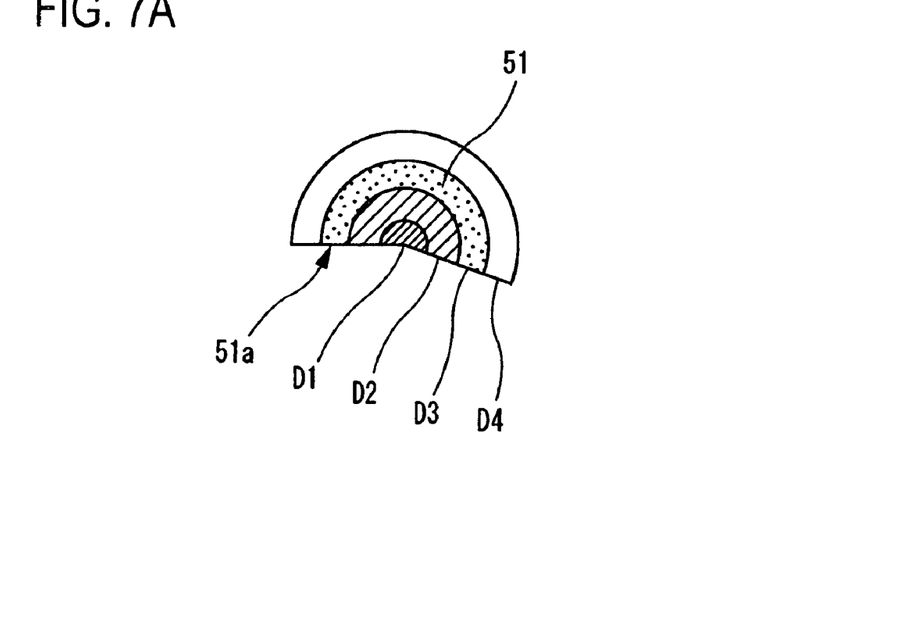
FIGS. 7A and 7B are conceptual illustrations of an example of a light distribution pattern formed by the vehicular lamp unit.
Figure 7B:
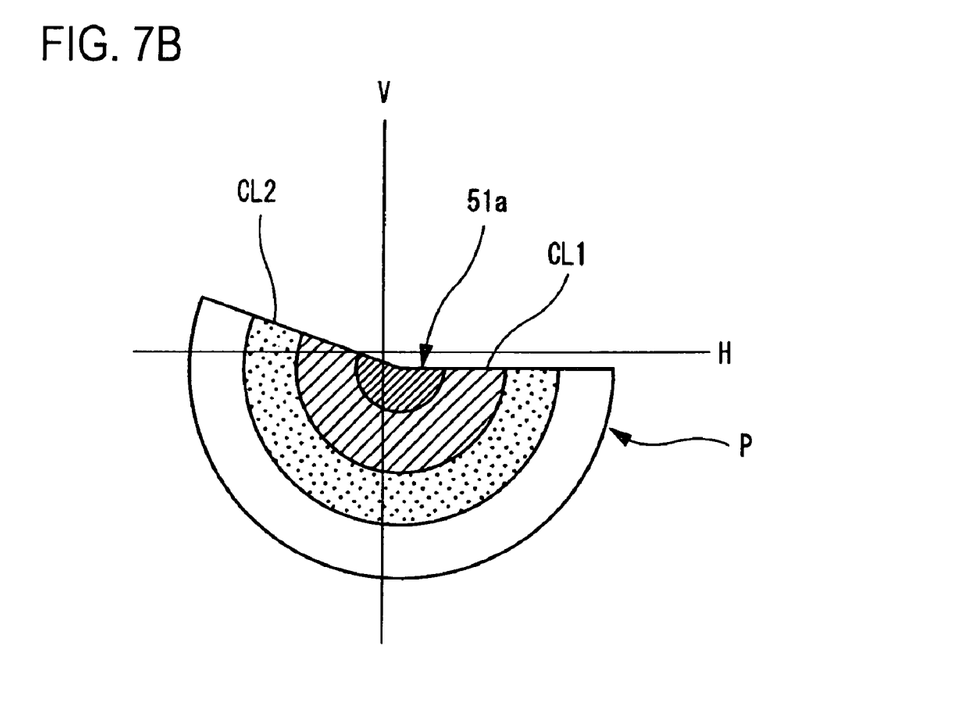

FIGS. 7A and 7B are conceptual diagrams for explaining examples of the light distribution pattern formed by the vehicular lamp unit of the present invention.

The light distribution pattern P shown in FIG. 7B is a low-beam distribution pattern that is formed on an imaginary vertical screen 25 meters in front of the vehicular lamp unit 100.

In this embodiment, the vehicular lamp unit 100 forms the light distribution pattern P that includes a horizontal cut line CL1, defining a contrast boundary between a bright area and a dark area in a substantially horizontal direction, and an oblique line CL2, defining a contrast boundary between a bright area and a dark area in a diagonal direction at a predetermined angle, the oblique line CL2 being 15 degrees with respect to the horizontal direction.

The projection lens 23 in this embodiment has a focal point on one side 51a of the light-emitting surface 51. As shown in FIG. 7A, the side 51a is a lower side of the light-emitting surface 51 extending in a substantially horizontal direction. The projection lens 23 radiates the light emitted from the light-emitting diode element 47 in a manner that the light intersects the optical axis Ax of the LED module 35. Accordingly, the projection lens 23 projects the shape of the side 51a of the light-emitting surface 51 to the upper side position of the light distribution pattern region shown in FIG. 7B.

The subwavelength grating 57 that reduces the reflection of light is formed on the opposing surface 59 of the LED module 35; and the density in which the subwavelength grating 57 is formed is varied from position to position so that the distribution of light intensity in the inverted image projected to the front is varied. Accordingly, the projection lens 23 creates an enlarged image of the opposing surface 59 which is the top layer of the LED module 35, and the radiation pattern configuration, which is shown in FIG. 7B, similar to the outline of the light emission region of the opposing surface 59, is obtained. Furthermore, by providing the subwavelength grating 57 on the opposing surface 59 with the density of grating 57 gradually varying, the light distribution pattern P with a predetermined configuration is formed so that it contains a uniform illuminance distribution.

In the area of the subwavelength grating 57 where the asperity density (density of the protrusions 63) is high, total reflection of the light inside the light-emitting diode element 47 does not occur, and therefore, a large amount of light is emitted to the surface of the chip (light-emitting diode element 47). On the other hand, total reflection of the light inside the light-emitting diode element 47 occurs in the area of the subwavelength grating 57 where the asperity density (density of the protrusions 63) is low, and therefore, a small amount of light is emitted to the surface of the chip (light-emitting diode element 47).

Accordingly, by gradually decreasing, as shown in FIG. 7A, the asperity densities D1, D2, D3, D4 of the substantially sector-shape subwavelength grating 57 from the center to the outside in the radius direction, the light emission luminance on the surface of the chip (in this embodiment, the opposing surface 59) can be varied from bright to dark in a manner that the luminance gradually varies. When the light-emitting diode element 47 thus formed is projected through the projection lens 23, it is possible to make the illuminance gradient in the boundary area smoother. As a result, a uniform light distribution pattern P as shown in FIG. 7B is produced even by the lamp formed of a single unit.

As seen from the above, according to the vehicular lamp unit 100 of this embodiment, the subwavelength grating 57 that reduces the reflection of light is formed on the surface (opposing surface 59) of one of the plurality of layers of the LED module 35, and the density in which the subwavelength grating 57 is formed is varied from position to position so as to vary the distribution of the light emission intensity in the inverted image projected to the front. Accordingly, total reflection does not occur inside the chip (light-emitting diode element) in the area that has a high asperity density, and a large amount of light can emit to the surface of the chip (light-emitting diode element). On the other hand, total reflection occurs inside the chip (light-emitting diode element) in the area that has a low asperity density, and a small amount of light is emitted to the surface of the chip (light-emitting diode element).

Accordingly, by gradually varying the asperity density, the light emission luminance on the surface of the chip is varied from bright to dark in a manner that the luminance gradually varies. Further, by projecting the chip through the projection lens 23, a light distribution pattern P having smooth illuminance gradient is created even by the lamp formed of a single lamp unit.

Next, a modified embodiment of the vehicular lamp unit according to the present invention will be described.

FIGS. 8A through 8D illustrate a subwavelength grating and illuminance gradient in the modified embodiment of the vehicular lamp unit of the present invention.

Figure 8A:
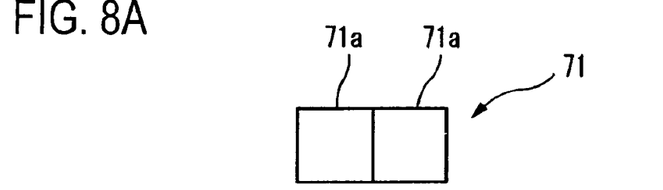
FIGS. 8A through 8D are explanatory diagrams showing the subwavelength grating and illuminance gradient in a modified embodiment of the vehicular lamp unit according to the present invention.
Figure 8B:
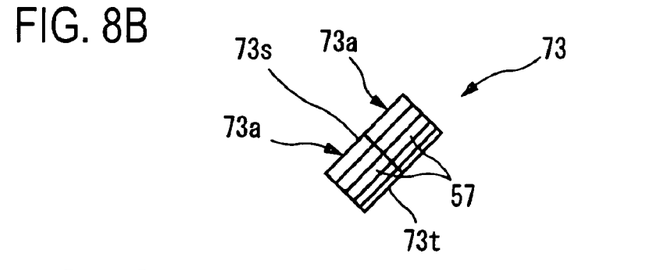
Figure 8C:
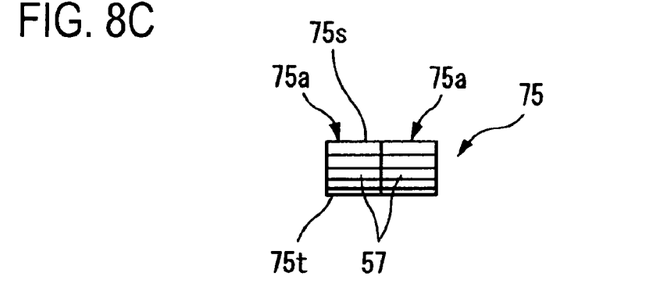
Figure 8D:
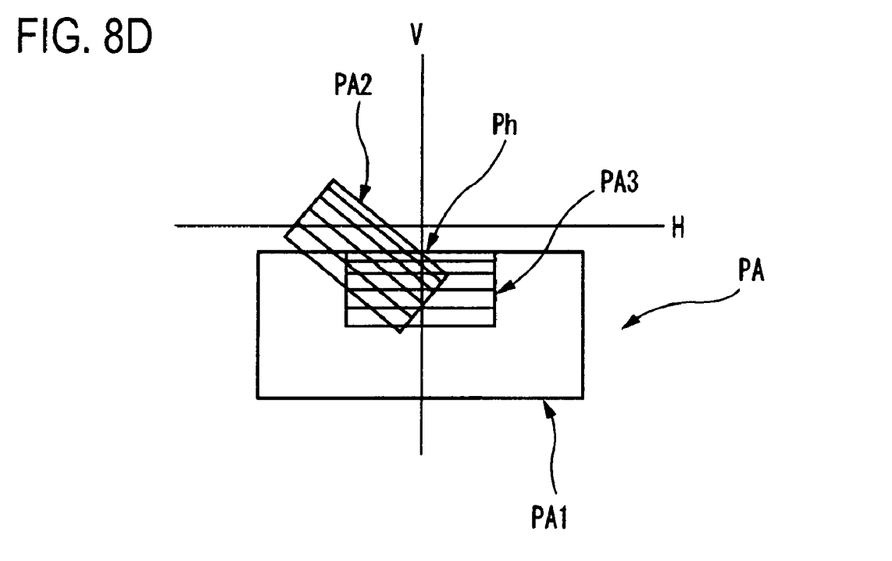

In this embodiment, as seen from FIGS. 8A, 8B and 8C, the vehicular lamp unit includes a plurality of LED modules 71, 73 and 75 that have different light distribution characteristics, respectively, and form a composite light distribution pattern PA shown in FIG. 8D using the light emitted from the LED modules 71, 73 and 75. Since the construction of other parts is the same as that of the above-described vehicular lamp unit 100, the same components are shown with the same reference numerals, and the description thereof will be omitted.

The LED modules 71, 73 and 75 create regions PA1, PA2 and PA3, respectively, each constituting a part of the composite light distribution pattern PA which is a low-beam distribution pattern. The LED modules 71, 73 and 75 respectively comprise two light-emitting diode elements 71*a* and 71*a*, 73*a* and 73*a*, and 75*a* and 75*a*, which have a square shape.

Further, each of the light-emitting diode elements 73*a* and 75*a* includes a subwavelength grating 57 on the surface of the top layer.

In the subwavelength grating 57 provided on the light-emitting diode element 73*a* (75*a*), the density gradually varies (to be higher) from one side 73*s* (75*s*) of two sides, which are opposed to each other on the surface of the top layer, to the other side 73*t* (75*t*). As described in the above, total reflection in the light-emitting diode element 73*a* (75*a*) does not occur in the area where the subwavelength grating 57 has a high asperity density, and a large amount of light is emitted to the surface of the chip. On the other hand, total reflection inside the light-emitting diode element 73*a* (75*a*) occurs in the area where the subwavelength grating 57 has a low asperity density, and a small amount of light is emitted to the surface of the chip.

Accordingly, the image of each of the chips (light-emitting diode elements 71*a*, 73*a* and 75*a*) of the LED modules 71, 73 and 75 is vertically and horizontally inverted by the projection lens 23, and thus, the light emitted from the light-emitting diode elements 71*a*, 73*a* and 75*a* forms a composite light distribution pattern PA shown in FIG. 8D.

In this composite light distribution pattern PA, the luminance at the pattern center portion Ph is high, so that particularly high forward visibility is obtained. In addition, since the density of the subwavelength grating 57 gradually varies from one side to the other, it is possible to gradually vary the light extraction efficiency from the light-emitting layer (light-emitting diode elements), making it possible to create a desired composite light distribution pattern PA with a uniform illuminance distribution.

The invention claimed is:

1. A vehicular lamp unit comprising:
    a light source module comprised of a substrate and a plurality of layers disposed on said substrate and include at least one light-emitting layer, and
    an optical element for projecting an image of light emitted from said light source module to a front of said vehicular lamp unit as an inverted image; wherein
    a subwavelength grating that reduces reflection of light is formed on one of surfaces of said plurality of layers of said light source module,
    a formation density of said subwavelength grating is varied from position to position so as to vary a distribution of light emission intensity in the inverted image projected to the front,
    said lamp unit is a direct projection lamp unit in which said optical element is a projection lens, and said light source module is disposed near a focal point of said projection lens, and
    the projection lens creates an enlarged image of the opposing surface which is the top layer of the light source module.

2. The vehicular lamp unit according to claim 1, wherein said plurality of layers comprises:
    a semiconductor light-emitting element disposed on said substrate;
    a phosphor layer disposed so as to cover said semiconductor light-emitting element; and
    an encapsulation member having a flat surface over Which the phosphor layer is formed.

3. The vehicular lamp unit according to claim 1, wherein a surface of a top layer in said light source module has a substantially rectangular shape, and
    density of said subwavelength grating gradually varies from one side to another side of two sides, which oppose to each other, of said substantially rectangular top layer.

4. The vehicular lamp unit according to claim 2, wherein a surface of a top layer in said light source module has a substantially rectangular shape, and
    density of said subwavelength grating gradually varies from one side to another side of two sides, which oppose to each other, of said substantially rectangular top layer.

\* \* \* \* \*